(12) United States Patent
Hollier

(10) Patent No.: US 7,511,753 B2
(45) Date of Patent: Mar. 31, 2009

(54) RANDOM ACCESS DECODER

(75) Inventor: Colin John Hollier, Malvern (GB)

(73) Assignee: QINETIQ Limited (GB)

( * ) Notice: Subject to any disclaimer, the term of this patent is extended or adjusted under 35 U.S.C. 154(b) by 726 days.

(21) Appl. No.: 10/485,722

(22) PCT Filed: Jul. 24, 2002

(86) PCT No.: PCT/GB02/03380

§ 371 (c)(1),
(2), (4) Date: Jan. 30, 2004

(87) PCT Pub. No.: WO03/012794

PCT Pub. Date: Feb. 13, 2003

(65) Prior Publication Data

US 2004/0240257 A1  Dec. 2, 2004

(30) Foreign Application Priority Data

Aug. 1, 2001 (GB) .................. 0118678.2

(51) Int. Cl.
*H04N 3/14* (2006.01)
*H04N 5/335* (2006.01)
*H04N 5/76* (2006.01)

(52) U.S. Cl. ............... 348/302; 250/208.1; 365/230.06; 348/231.99

(58) Field of Classification Search .................. 348/302, 348/304, 307–310; 250/208.1; 365/230.06
See application file for complete search history.

(56) References Cited

U.S. PATENT DOCUMENTS 4,985,872 A * 1/1991 Halbert, III ............ 365/230.09
5,604,712 A    2/1997 Priebe
5,665,959 A * 9/1997 Fossum et al. ............ 250/208.1
5,737,570 A * 4/1998 Koch .......................... 711/149
6,153,468 A   11/2000 Forbes et al.
6,518,597 B1 * 2/2003 Kim .............................. 257/82
6,900,837 B2 * 5/2005 Muramatsu et al. ......... 348/243
7,030,920 B1 * 4/2006 Hayashi et al. ............. 348/302

FOREIGN PATENT DOCUMENTS

GB    2 014 771    8/1979
GB    2 308 703    7/1997
JP    59-188768   10/1984

* cited by examiner

*Primary Examiner*—Tuan Ho
*Assistant Examiner*—Chia-Wei A Chen
(74) *Attorney, Agent, or Firm*—McDonnell Boehnen Hulbert & Berghoff LLP

(57) ABSTRACT

A random access decoder (114) comprising a plurality of decoder circuit elements (116), each decoder circuit element having a unique electronic address and a binary data output (122), means for applying an input signal (124) to each of the decoder circuit element and where each decoder circuit element places data on its binary data output (122) only when the unique electronic address of a particular decoder circuit element (116) matches the applied input signal (124) and wherein the unique electronic address of each of the plurality of decoder circuit elements (116) is electronically loaded into each of the decoder circuit elements (116). In one embodiment, each decoder circuit element (116) comprises equivalent components electrically connected in the same arrangement.

11 Claims, 5 Drawing Sheets

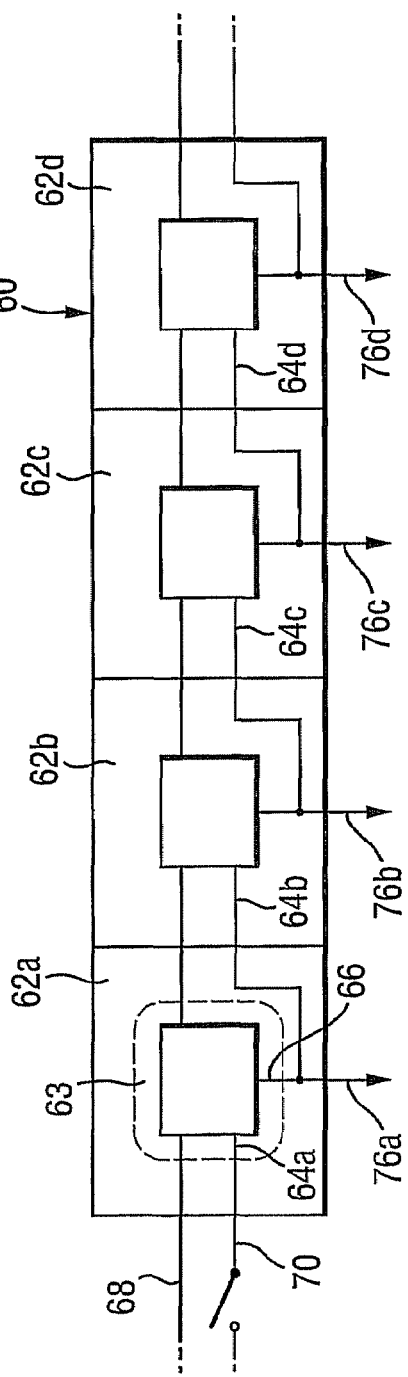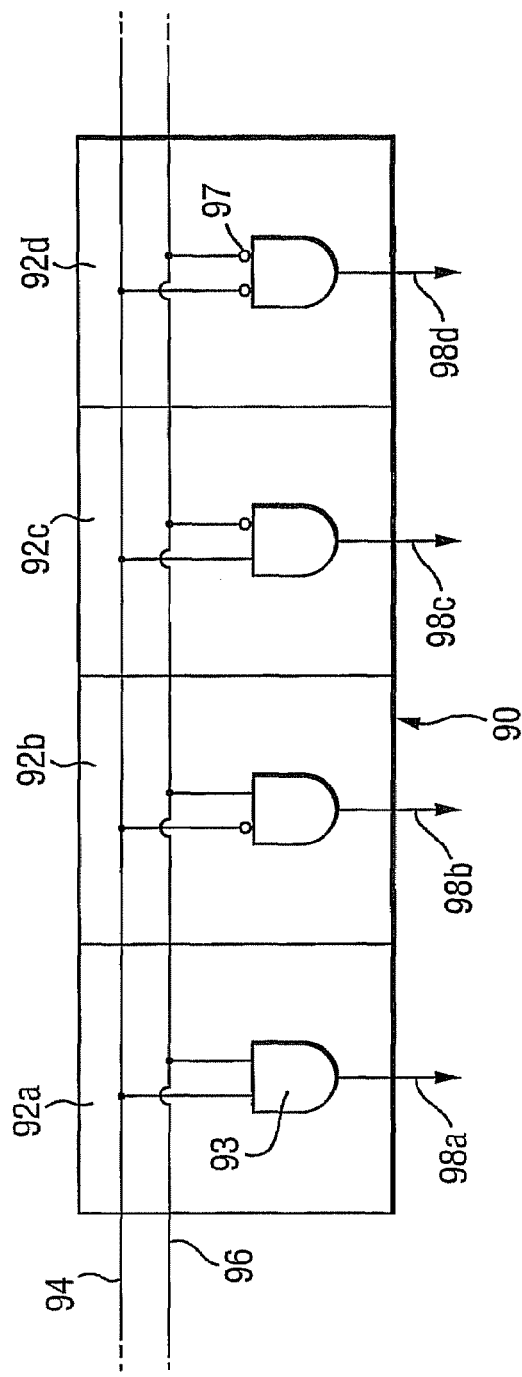

RANDOM ACCESS DECODER

BACKGROUND OF THE INVENTION (1) Field of the Invention

This invention relates to random access decoders, and in particular to a random access decoder for use in an imaging array readout circuit.

(2) Description of the Art

In many devices, such as visible or infra-red imaging detectors, it is necessary to read information from a two dimensional array of detector pixels. This can be achieved using a series of switches to transport data from particular pixel of the two dimensional array on to a common bus line. The two dimensional array of pixel elements used in infra-red imaging arrays are usually incorporated with row and column readout circuitry on a single silicon readout chip. Each pixel element may also comprise additional electronic components such as amplifiers, noise filters etc. Such chips are typically fabricated using complementary metal oxide semiconductor (CMOS) technology.

One type of row and/or column readout circuitry commonly used in imaging detectors is a shift register. A shift register typically comprises a chain of flip-flop type shift register elements. A logic "1" is loaded into the first shift register element, and each shift register element is then sequentially enabled by a series of clock pulses.

A two dimensional array incorporating row and column shift registers is read by extracting data from the first pixel of the first row through to the last pixel in the first row and then repeating the process for each subsequent row. In this way, the entire array is sequentially read by rastering through each pixel in turn. As shift registers only operate sequentially, they are unable to randomly access pixels in a two dimensional array. The inability to randomly read data from any pixel in the array is a disadvantage, especially in larger arrays, when data from only a particular portion or "window" of the array is of interest.

Another type of row and/or column readout circuitry is a decoder. Decoders typically comprise a plurality of unique decoder circuit elements, and any of these decoder elements can be accessed as required. Decoders, unlike shift registers, will thus allow truly random access to any pixel in a two dimensional array.

A disadvantage of known decoders is the requirement to design a plurality of unique decoder elements; such design work is time consuming and may also be complex when using non-binary array sizes. The requirement to produce a custom design for each decoder element also adds to the cost and complexity of fabricating the readout circuitry. For example, the requirement for unique row and column decoder circuit elements limits the maximum array size that can be produced using known CMOS fabrication techniques.

For a more complete review of the multiplexing techniques used in infrared detector applications see chapter 5 of the Infrared and electro-optical handbook, vol 3, Electro-optical components, W. D. Rogatto, SPIE Optical Engineering Press, Bellingham, Wash.

SUMMARY OF THE INVENTION

According to a first aspect of this invention, a decoder comprises a plurality of decoder circuit elements, each decoder circuit element having a unique electronic address and a binary data output, means for applying an input signal to each of the decoder circuit element, each decoder circuit element placing data on its binary data output only when the unique electronic address of a particular decoder circuit element matches the applied input signal, characterised in that the unique electronic address of each of the plurality of decoder circuit elements is electronically loaded into each of the decoder circuit elements.

Advantageously, each decoder circuit element comprises equivalent electrical components electrically connected in the same arrangement. In other words, the decoder circuit elements are such that they will all function in the same way.

Conveniently, two or more of the decoder circuit elements are formed from physically identical circuit designs. Alternatively, all the decoder circuit elements are formed from physically identical circuit designs.

As described below, having a decoder made from physically identical decoder circuit elements reduces the complexity of designing a decoder circuit and also proves advantageous when fabricating such devices.

In a further embodiment, each decoder circuit element comprises an adder component, and the adder components of each decoder circuit element are connected in series such that each decoder circuit element is electronically loaded with a unique electrical address.

The adder component may be a "+1" adder, or any device which performs a similar function. The adder may also add a negative number (e.g. "−1"); in other words it may provide a subtracting type function.

Conveniently, each decoder circuit element comprises a comparator component, and the comparator component of each decoder circuit element determines whether the unique electrical address of a particular decoder circuit matches the applied input signal.

According to a second aspect of this invention, a readout circuit comprises a linear array of pixel elements, a decoder according to the first aspect of this invention having a decoder circuit element connected to each pixel of the linear array, wherein the data associated with each pixel element can be read from the linear array in any order and placed on one or more output signal buses.

According to a third aspect of this invention, a readout circuit has a two dimensional array of pixel elements operably connected along row and column lines, row and column decoders connected to each of the row and column lines which comprise decoders according to the first aspect of this invention and wherein the data associated with each pixel element can be read from the array in any order and placed on one or more output signal buses.

Advantageously, the readout circuit is fabricated on a single silicon chip conveniently using CMOS techniques.

According to a fourth aspect of this invention, an infra-red detector may incorporate a readout circuit according to the second or third aspects of this invention.

DESCRIPTION OF THE FIGURES

This invention will now be described, by way of example only, with reference to following drawings in which;

FIG. 2 is an illustration of a prior art shift register;

FIG. 3 is an illustration of a prior art decoder;

DETAILED DESCRIPTION OF THE INVENTION

Figure 1:
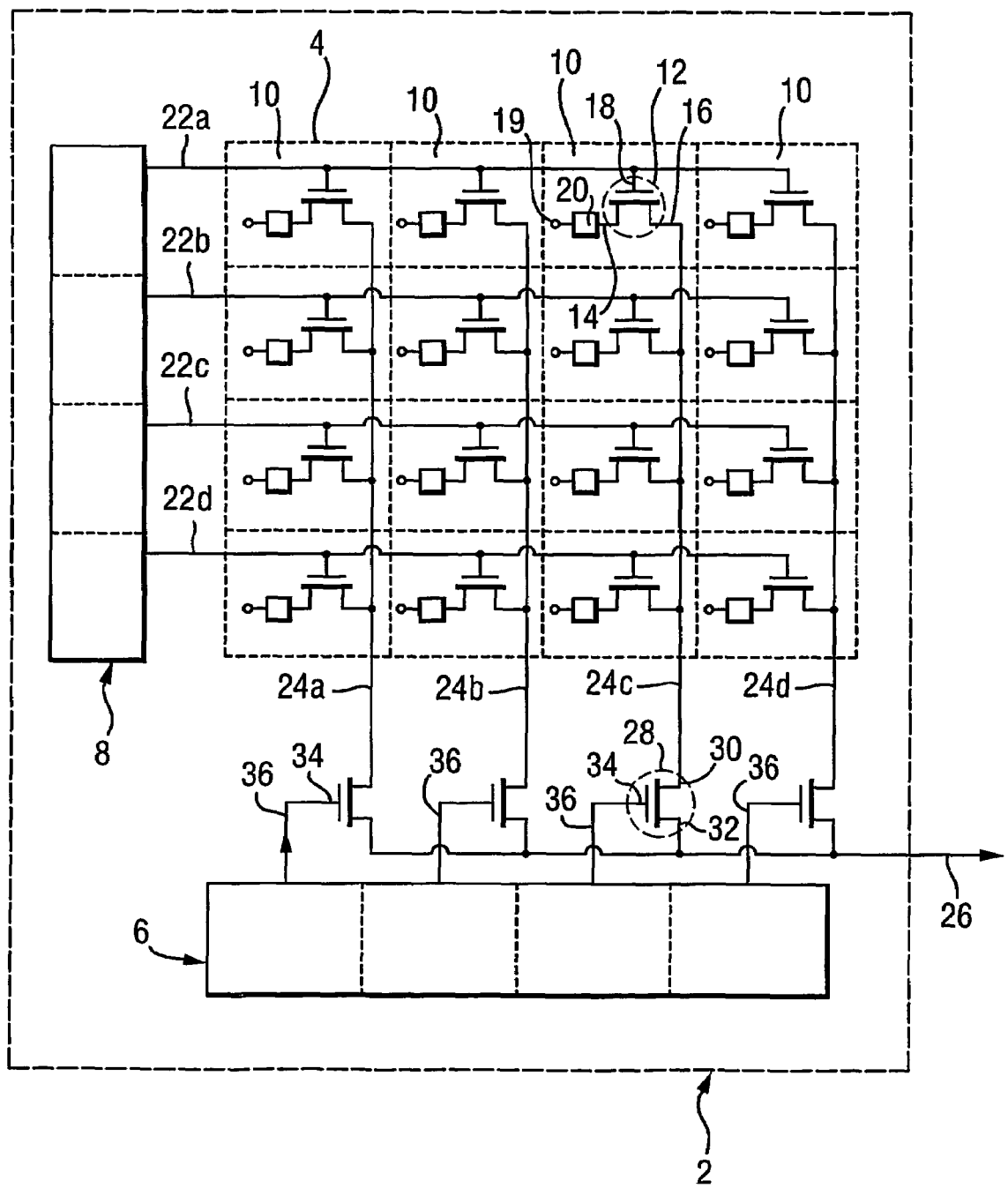
FIG. 1 is an illustration of a 4×4 imaging array incorporating column and row readout circuitry.

Referring to FIG. 1, a readout integrated circuit 2 comprises an array 4 of pixel elements 10, column circuitry 6 and row circuitry 8.

Each pixel element 10 comprises a pixel MOSFET switch 12 having an input connection 14, an output connection 16 and a gate connection 18. An interconnect 19, such as an indium bump, permits a pixel of an external detector array (not shown) to be electrically connected via any additional circuitry 20 to the input connection 14. The output connection 16 is connected to a column bus line 24, and the gate connection 18 is connected to a row bus line 22. Each row bus line 22 is connected to an output of the row circuitry 8.

A person skilled in the art would recognise that the additional circuitry 20 may comprise a plurality of different elements. For example, amplifier and focal plane processing circuit elements. The actual content of the additional circuitry will vary depending on the specific application, and is immaterial to the present invention.

Each column bus line 24 is connected to the input connection 30 of a column MOSFET switch 28. The output connection 32 of each column MOSFET switch 28 is connected to an output bus line 26, and each gate connection 34 is connected to an output 36 from the column circuitry 6.

In operation, the data present at a pixel 10 on the array 4 may be placed on the output bus line 26 by applying a voltage to the gate connections of an appropriate row of pixels whilst also applying a voltage to the gate connection of the appropriate column switch. The accessibility of data associated with the pixels is thus determined by the characteristics of the column circuitry 6 and the row circuitry 8.

It should be noted that the readout circuit described with reference to FIG. 1 comprises a single output bus line 36 and therefore provides a completely serial output of data. A person skilled in the art would recognise that data from certain pixels could actually be routed to different data output busses and thereby provide a degree of parallel data output.

Referring to FIG. 2, a typical prior art shift register 60 is shown.

The shift register 60 comprises a plurality of shift register cells 62a,b,c,d etc. Each shift register cell 62 comprises a D-type latch 63 having an input connection 64 and an output connection 66. The input connection 64 of the first shift register cell 62a is connected to a shift register reset line 70. The input connection of subsequent shift register cells 62b, c,d are connected to the output connection of the preceding shift register cell. A clock line 68 also supplies a periodic clock signal to each of the shift register cells 62.

In operation, a reset signal is applied via the reset line 70 to the input connection 64a of the first shift register cell 62a. The D-type latch will then place a logical "1" output on the output line 76a for the duration of one clock cycle. At the end of the clock cycle, a logical "1" will be present on the input on the second shift register cell 62b (i.e. the logical "1" of the first shift register cell output line 76a) which causes a logical "1" to be placed on output 76b for the subsequent clock cycle, whilst the output line 76a returns to a logical "0" output. In this way, the logical "1" can be clocked down the shift register thereby providing a sequential enable signal.

A shift register of the type described with reference to FIG. 2 may be used as the row circuitry and/or column circuitry in the integrated circuit 2 that was described with reference to FIG. 1. The shift register can be readily implemented as an integrated circuit, and each shift register cell only requires single connections to shift register cells either side of it in the chain and to the clock signal. However, as the shift register can only operate in a sequential enable mode, the entire array has to be read out as a raster to extract the image data. The shift register is therefore unsuitable in applications where there is a requirement to read only certain parts, or "windows", of the array.

Referring to FIG. 3, a typical prior art random access decoder 90 is shown.

The decoder 90 comprises a plurality of unit cells 92a,b,c,d each having a comparator 93 that is connected to digital bus lines 94,96. Each unit cell 92 of the decoder is made uniquely addressable by the inclusion of "NOT" gate elements (e.g. 97). The application of an appropriate digital code to the bus lines 94,96 will cause one unit cell (e.g. 92b) to place a logical "1" on its associated comparator output line (98b); all the other comparator output lines (98a,c,d) are held low.

In the example given in FIG. 3, only two bus lines are required to uniquely identify the four unit cells. However, as the number of unit cells increases, the number of bus lines will also increase; for example 8 bus lines would be required if 256 comparator cells were to have unique addresses, and 10 bus lines would be needed to provide 1024 unique addresses etc.

A random access multiplexer of the type described with reference to FIG. 3 may be used as the row and/or column circuitry in the integrated circuit 2 that was described with reference to FIG. 1. Truly random access to the data associated with any pixel on the array is then possible, allowing windows or individual pixels of the display to be updated at a faster rate than the remainder of the display.

A disadvantage of the prior art random access decoder circuit 90 described with reference to FIG. 3 is the requirement for each cell of the decoder to be a unique circuit. A custom circuit design is thus required for each cell of the decoder; producing the circuit designs can be time consuming, and such designs can be somewhat complex with non-binary array sizes.

To attain acceptable performance it is generally desirable to have all the circuitry associated with a readout circuit contained on a single silicon chip. However, the photo-lithographic masks that are used to reproduce CMOS circuits are typically limited in size and hence the maximum chip size that can be fabricated is also limited accordingly. Various techniques are known to those skilled in the art which overcome, to a certain extent, the size limitations associated with CMOS fabrication techniques and allow circuits to be fabricated that are larger than the size of the lithographic mask.

One example of a technique used in the art to increase the size of CMOS circuits that can be fabricated is reticle stitching. A plurality of different circuit designs are imprinted on several different areas of one or more photo-lithographic masks. The circuit is then built up on a single silicon chip by combinations of the various different circuit designs contained on the various masks.

Although the size of a CMOS circuit can be increased using a reticle stitching technique, there is a limitation on the number of different circuit designs that can be incorporated on a single photolithographic mask. The number of different masks which can be used with the various types of CMOS fabrication equipment can also be limited, which in turn also limits the maximum circuit size and overall complexity that can be attained. The necessary uniqueness of each decoder cell circuit can thus prove a disadvantage when fabricating devices using reticle stitching CMOS technology, as a plurality of masks containing a plurality of circuit designs may required if a complex circuit design is to be implemented.

Figure 4:
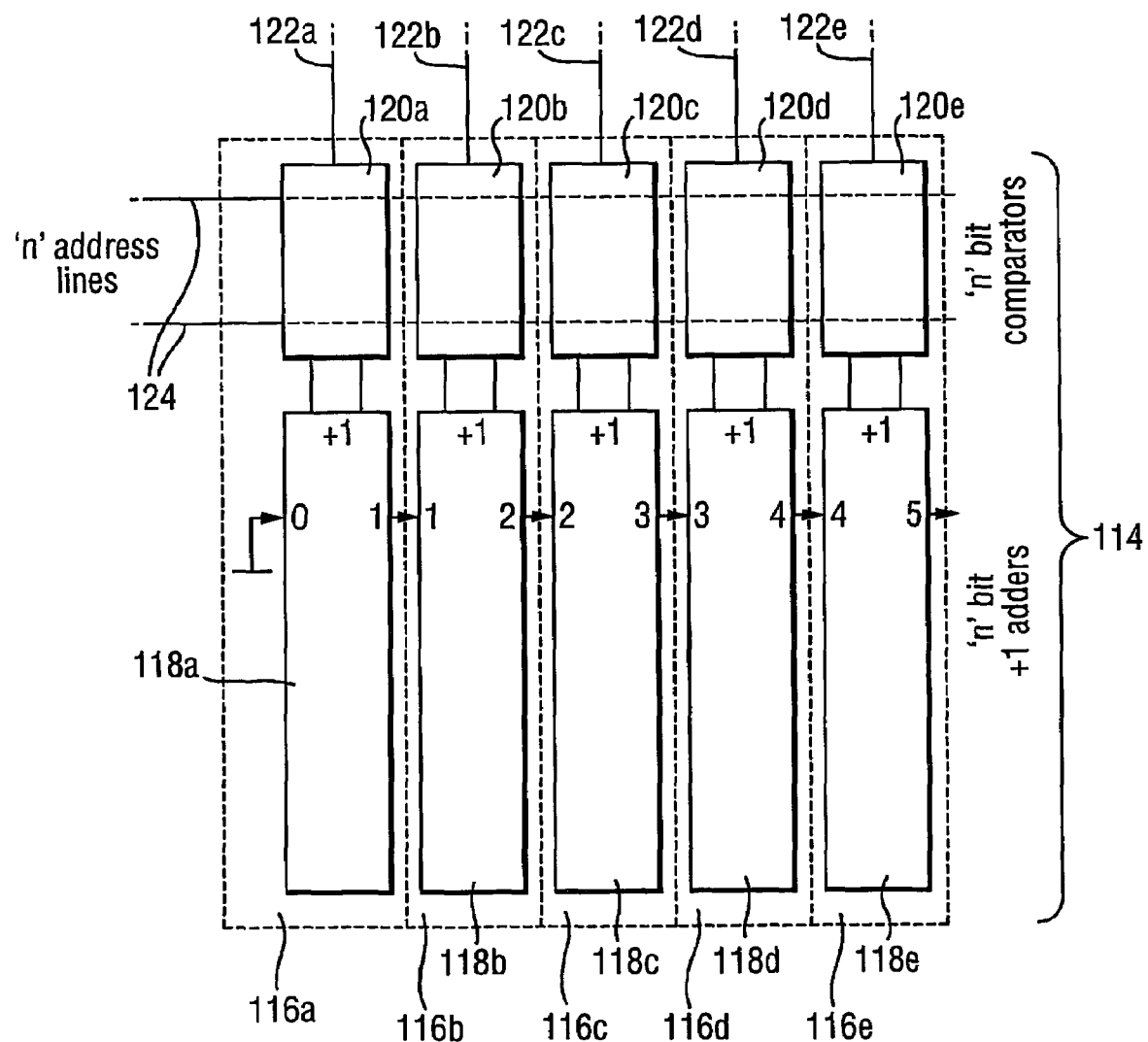
FIG. 4 is an illustration of a decoder according to the present invention.

Referring to FIG. 4, a random access decoder 114 according to the present invention is shown. The random access decoder 114 comprises a plurality of decoder cells 116, and each of the decoder cells 116 comprise a "+1" adder 118 and a comparator 120.

A decoder 114 according to the present invention is initiated by applying a "0" to the first of the "+1" adders 118a. The first adder 118a then adds "1" to the "0" input and outputs the resultant "1" to the second of the "+1" adders 118b. The second of the "+1" adders 118b then adds "1" to the output of the first "+1" adder and outputs a "2" to the third of the "+1" adders 118c. In this way, when the device has been powered each decoder cell has a "+1" adder 118 loaded with a unique digital number.

Any data applied down the digital address bus 124 is compared by each comparator 120 to the unique digital number stored by each "+1" adder 118. If the digital number applied down the digital address bus matches the stored digital number, a logical "1" enable signal is placed on the relevant comparator output line 122; all other comparator output lines are held low.

The digital address data required to activate decoder elements may be applied to the "n" address line of the digital address bus 124 from an external (i.e. off-chip) digital number generation means via "n" electrical connections. Alternatively, the readout circuit chip may additionally comprise a serial-to-parallel convertor which receives a serial digital code from an external digital generation means via a single electrical connection, and converts that signal into parallel digital data which is applied in parallel to the "n" address lines.

A decoder of the present invention may be used as the row and/or column circuitry in the integrated circuit 2 that was described with reference to FIG. 1. Truly random access to the data associated with any pixel on the array is then possible, allowing windows or individual pixels of the display to be updated at a faster rate than the remainder of the display. In other words, pixels in a two dimensional array having row and column decoders according to the present invention can be accessed in any desired sequence.

Unlike prior art decoders, the design of each decoder cell 114 of the present invention can be identical. A single circuit design can thus be replicated a plurality of times to build up a multiple element decoder. This decreases the time and effort required to design the decoder, and also makes circuit design easier when decoders having non-binary break points are required.

The identical circuit design of each decoder element also proves advantageous when fabricating silicon readout chips using CMOS reticle stitching techniques. A decoder circuit design, containing a plurality of decoder elements, can be imprinted on one area of the photo-lithographic mask and then replicated a plurality of times to build up a large area decoder circuit on a single Silicon chip. In this way, single readout chips can be fabricated having a larger area and a greater number of rows and/or columns than is possible using prior art decoder circuit designs.

A decoder according to the present invention also has the advantage of consuming less power than prior art shift registers and prior art decoders. Prior art shift registers are relatively power hungry because of the continual application of a clocking signal, whilst the electronic circuitry required to make prior art decoders elements uniquely addressable consumes more power than decoder elements according to the present invention. Low power operation is especially advantageous in cooled IR detector systems; the decreased power dissipation reduces the unwanted heating effects associated with the read out chip.

Referring to FIG. 5, it is shown how a decoder according to the present invention can be used to load a shift register at any point along its length. Components similar to those described with reference to previous figures have been assigned like reference numerals.

Figure 5A:
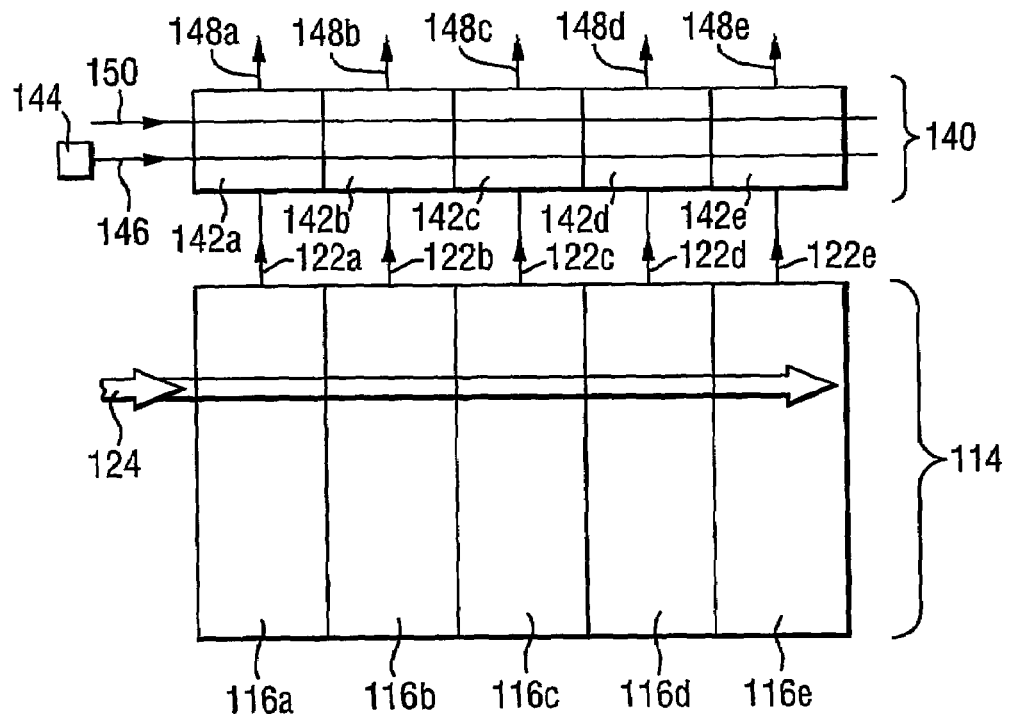
FIG. 5 shows a readout circuit comprising a decoder of the present invention and a shift register.

FIG. 5a shows a decoder 114 as described with reference to FIG. 4 and a shift register 140. The shift register 140 comprises a number of shift register cells 142 each having an binary output line 148. Each shift register cell 142 is also capable of receiving a reset signal from the output line 122 of the decoder 114. A clock signal from a clock 144 is fed to each shift register cell 142 via a clock line 146, and a binary control signal is fed along the control line 150.

In operation, the binary control signal applied to the control line 150 determines whether the shift register 140 operates in sequential enable mode or in data receipt mode. In data receipt mode, the shift register elements 142 are configured to accept any signal placed on the corresponding output line 122 of the decoder 114. This enables a shift register element to be reset by the decoder causing it to place a logical "1" on its binary output line 148 for the duration of a clock pulse. In sequential enable mode, the shift register will clock an enable signal down its length. This configuration permits normal shift register operation (i.e. sequential enable operation of the type described with reference to FIG. 2) to be initiated and stopped at any point along the shift register.

Figure 5B:
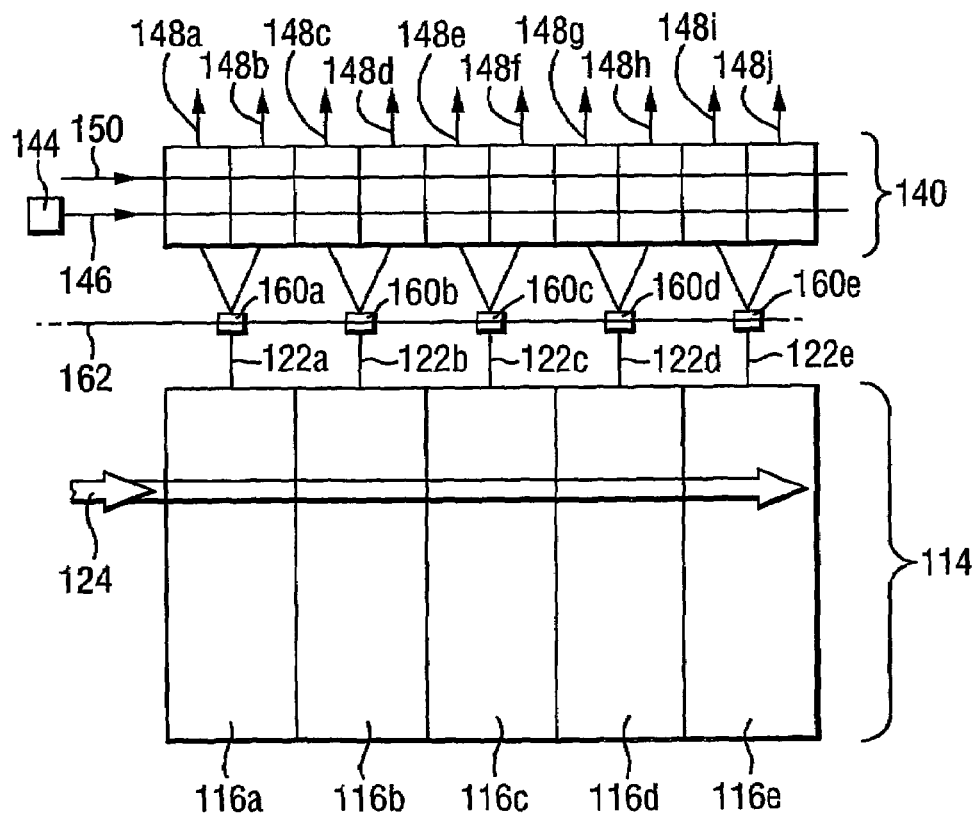

FIG. 5b shows an alternative configuration to that described with reference to FIG. 5a. Each output line 122 of the decoder 114 is routed to one of two shift register elements via a two-way switch 160. A switch control line 162 provides each two-way switch 160 with the binary data signal that determines which shift register element receives data from the output line 122. In this way, any one of the shift register elements can be reset by activating a particular decoder element by placing appropriate data on the digital address bus 124 and by ensuring the two-way switch 160 is in the desired position by applying appropriate data to the switch control line 162.

The configuration of FIG. 5b requires fewer decoder elements for a given number of shift register elements. This reduces the number of decoder elements required to address a given number of shift register elements, therefore reducing the size of the electronic circuitry required. A person skilled in the art would recognise that additional lines of switches could also be interposed between the decoder and the shift register thereby further decreasing the number of decoder elements required. However, the skilled person would also appreciate that increasing the number of intervening switches will increase the complexity of the circuit design and this will reduce the above mentioned advantage of being able to fabricate circuits from a plurality of repeated circuit elements.

It can thus be seen that readout circuits may comprise row and column circuitry using decoders of the present invention alone, or they could comprise such decoders combined with additional components such as shift registers. Alternative readout circuit configurations incorporating decoders of the present invention would also be apparent to those skilled in the art.

A person skilled in the art would also recognise the wide applicability of decoders according to this invention. Not only could such decoders be used when fabricating readout circuits for imaging arrays, they could be used for reading and/or writing data to data storage pixels (e.g. for addressing random access memory). It would also be possible to use such decoders for addressing pixels in a display. In fact, such a decoder could be used in any application where it is necessary for a parallel data store to be output or input serially.

EXAMPLE

Figure 6:
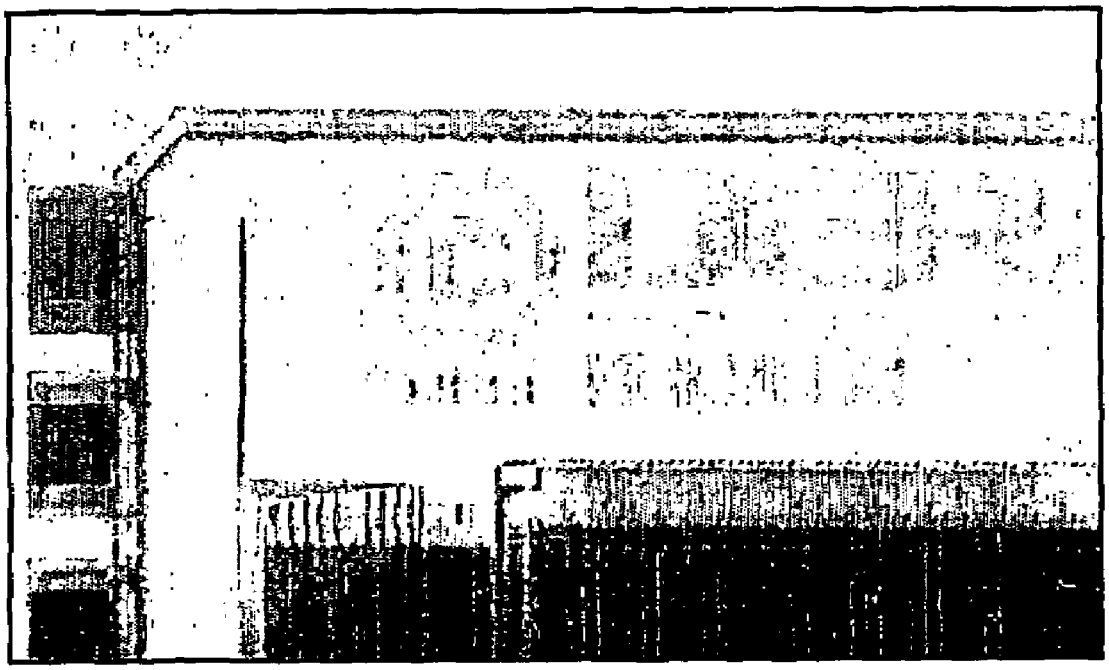
FIG. 6 is a photograph of a segment of a Silicon readout chip comprising a decoder according to the present invention.

Referring to FIG. 6, a photomicrograph of a section of a Silicon readout chip fabricated using a CMOS reticle stitching technique is shown. The integrated circuit comprises an array of 1024 by 768 pixels with associated column and row decoders according to the present invention.

The row and column decoder elements are fabricated to identical circuit designs, and can be accessed in a random manner at speeds comparable to the prior art decoders described with reference to FIG. 3. The chip is designed to be incorporated with a InSb detector array for use as a cooled infrared detector.

The invention claimed is:

1. A readout circuit comprising at least one decoder, each decoder comprising a plurality of decoder circuit elements and means for applying an input signal to each of the decoder circuit elements, wherein each decoder circuit element has a unique electronic address and a binary data output and places data on its binary data output only when the unique electronic address of a particular decoder circuit element matches the applied input signal, the unique electronic address of each of the plurality of decoder circuit elements being electronically loadable into each of the decoder circuit elements, characterized in that the readout circuit is adapted for use with an imaging array and further comprises a shift register associated with each decoder, each decoder being arranged to load the shift register associated therewith at any point along the length of the shift register, and further wherein each decoder circuit element has associated therewith an adder, with said adders connected in series, with each adder adapted to add a value to its input and provide its output to an input of the next adder if present, wherein each output provides a unique address for its associated decoder circuit.

2. A readout circuit as claimed in claim 1, wherein each decoder circuit element comprises equivalent electrical components electrically connected in the same arrangement.

3. A readout circuit as claimed in claim 1, wherein two or more of the decoder circuit elements are formed from physically identical circuit designs.

4. A readout circuit as claimed in claim 1, wherein all decoder circuit elements are formed from physically identical circuit designs.

5. A readout circuit as claimed in claim 1 wherein each decoder circuit element comprises a comparator component, and where the comparator component of each decoder circuit element determines whether the unique electrical address of a particular decoder circuit matches the applied input signal.

6. A readout circuit as claimed in claim 1, and arranged to read data from an imaging array having a number of rows and/or columns.

7. A readout circuit as claimed in claim 1, wherein the readout circuit is fabricated on a single silicon chip.

8. A readout circuit as claimed claim 1 fabricated using CMOS techniques.

9. An infra-red detector having a readout circuit as claimed in claim 1.

10. A readout circuit according to claim 1 arranged to read data from an imaging array comprising a linear array of pixel elements.

11. A readout circuit according to claim 1 arranged to read data from an imaging array comprising a two dimensional array of pixel elements operably connected along row and column lines.

* * * * *